(12) United States Patent
Dagenais et al.

(10) Patent No.: US 6,610,612 B2
(45) Date of Patent: Aug. 26, 2003

(54) METHOD OF EFFICIENT CONTROLLABLE AND REPEATABLE WET OXIDATION IN A PHOSPHOROUS-RICH III-V MATERIAL SYSTEM

(75) Inventors: Mario Dagenais, Chevy Chase, MD (US); Bikash Koley, College Park, MD (US); Frederick G. Johnson, Lanham, MD (US)

(73) Assignees: The University of Maryland, Riverdale, MD (US); The United States of America as represented by the National Security Agency, Washington, DC (US)

( * ) Notice: Subject to any disclaimer, the term of this patent is extended or adjusted under 35 U.S.C. 154(b) by 0 days.

(21) Appl. No.: 10/012,352

(22) Filed: Dec. 12, 2001

(65) Prior Publication Data

US 2002/0127758 A1 Sep. 12, 2002

Related U.S. Application Data

(60) Provisional application No. 60/254,787, filed on Dec. 13, 2000.

(51) Int. Cl.$^7$ .......................... H01L 21/00; H01L 21/31
(52) U.S. Cl. .......................... 438/767; 438/46; 438/47
(58) Field of Search .......................... 438/46, 47, 767, 438/770, 773

(56) References Cited

U.S. PATENT DOCUMENTS

| | | | |
|---|---|---|---|
| 5,567,980 A | 10/1996 | Holonyak, Jr. et al. | |
| 5,972,742 A | * 10/1999 | Zhang et al. | 438/164 |
| 6,011,811 A | 1/2000 | Ohlander et al. | |
| 6,127,202 A | * 10/2000 | Kapur et al. | 438/47 |
| 6,239,033 B1 | * 5/2001 | Kawai | 438/693 |

OTHER PUBLICATIONS

B. Koley et al., Accelerated and reproducible oxidation of strain–compensated short–period superlattice structures for incorporation in InP based devices, *Applied Physics Letters*, Jan. 1, 2001, vol. 78, No. 1, pp. 64–66.

A. Kasukawa et al., Very Low Threshold Current 1–3 μm In AsyP 1–$_y$/In P BH Strained–Layer Quantum Well Laser Diodes Grown BY MOCVD, *Electronic Letters*, Dec. 2, 1992, vol. 28, No. 25, pp. 2351–2353.

F. A. Kish et al., Planar native–oxide index–guided AlxGa$_{1-x}$As–GaAs quantum well heterostructure lasers, *Appl. Phys. Lett.*, Sep. 30, 1991, vol. 59, No. 14, pp. 1755–1757.

S. J. Caracci et al., High–performance planar native–oxide buried –mesa index–guided AlGaAs–GaAs Quantum well heterostructure lasers, *Appl. Phys. Lett.*, Jul. 20, 1992, vol. 61, No. 3, pp. 321–323.

N. Iwai et al., 1.3 μm GaInAsP SL–QW Al–oxide confined inner stripe lasers on p–InP substrate with AlInAs–oxide confinement layer, *Electronics Letters*, Jul. 9, 1998, vol. 34, No. 14, pp. 1427–1428.

(List continued on next page.)

*Primary Examiner*—Alexander Ghyka
(74) *Attorney, Agent, or Firm*—Foley & Lardner

(57) ABSTRACT

A method of selectively oxidizing III–V semiconductor material is provided. There is provided a III–V semiconductor system comprising a short-period super lattice (SSL) of N periods of alternating layers of an aluminum-bearing III–V compound semiconductor material and a second III–V semiconductor material where $N \geq 2$, at least one phosphorous-rich III–V semiconductor layer, and at least one substantially phosphorous-free III–V semiconductor layer between each of the at least one phosphorous-rich layers and the SSL. The III–V semiconductor system is exposed to oxidizing atmosphere to selectively oxidize at least a portion of the SSL.

35 Claims, 5 Drawing Sheets

OTHER PUBLICATIONS

N. Iwai et al., high-performance 1.3 μm InAsP Strained-Layer Quantum–Well ACIS (Al–Oxide Confined Inner Stripe) Lasers, *IEEE Journal of Selected Topics in Quantum Electronics*, May/Jun. 1999, vol. 5, No. 3, pp. 694–700.

B. Koley et al., A Method of Incorporating Wet–oxidized III–V Semiconductor Layers into Indium Phosphide based Lasers and Amplifiers, 11th *International Conference on Indium phosphide and Rlelated materials* 16–20 May 1999 Davos, Switzerland, pp. 20–23.

B. Koley et. al., Low Threshold Current 1.55μm Lasers using Novel Selective Oxidation of Short–period Superlattice, *IEEE* 1999, pp. 529–530.

J. M. Dallesasse et al., Hydrolyzation oxidation of $Al_{1-x}As$–AlAs–GaAs quantum well heterostructures and superlattices, *Appl. Phys. Lett.*, Dec. 24, 1990, vol. 57, No. 26, pp. 2844–2846.

G. M. Yang et al., Ultralow threshold current vertial–cavity surface–emitting lasers obtained with selective oxidation, *Electronic Letters*, May 25, 1995, vol. 31, No. 11, pp. 886–888.

M. H. Macdougal et al., Ultralow Threshold Current Vertical–Cavity Surface–Emitting Lasers with AlAs Oxide–GaAs Distributed Bragg Reflectors, *IEEE Photonics Technology Letters*, Mar. 3, 1995, vol. 7, No. 3, pp. 229–231.

D. L. Huffaker et al., Native–Oxide defined ring contact for low threshold vertical–cavity laser, *Appl. Phys. Lett.*, Jul. 4, 1994, vol. 65, No. 1, pp. 97–99.

K. D. Choquette et al., Low Threshold voltage vertical–cavity lasers fabricated by selective oxidation, *Electronic Letters*, Nov. 24, 1994, vol. 30, No. 24, pp. 2043–2044.

K.L. Lear et al., Selectively oxidised vertical cavity surface emitting lasers with 50% power conversion efficiency, *Electronic Letters*, Feb. 2, 1995, vol. 31, No. 3, pp. 208–209.

Y. Hayashi et al., Lasing Characteristics of Low–Threshold Oxide Confinement InGaAs–GaAlAs Vertical–Cavity Surface–Emitting Lasers, *IEEE Photonics Technology Letters*, Nov. 1995, vol. 7, No. 11, pp. 1234–1236.

B. J. Thibeault et al., Reduced Optical Scattering Loss in Vertical–Cavity Lasers Using a Thin (300 Å) Oxide Aperture, *IEEE Photonics Technology Letters*, May 5, 1996, vol. 8, No. 5, pp. 593–595.

N. Ohnoki et al., GaInAs/AlGaInAs Semiconductor Lasers with AlAs Oxide Current Confinement Structure, *Jpn. J. Appl. Phys.* vol. 36 (1997), part 1, No. 3B, Mar. 3, 1997, pp. 1896–1899.

S. J. Caracci et al., Long wavelength (λ~ 1.5μm) native–oxide–defined In AlAs–InP–InGaAsP quantum well heterostructure laser diodes, *J. Appl. Phys.* Mar. 1, 1994, vol. 75, No. 5, pp. 2706–2708.

B. Koley et al., A method of highly efficient hydrolyzation oxidation of III–V semiconductor lattice matched to indium phosphide, *Applied Physics Letters*, Aug. 30, 1999, vol. 75, No. 9, pp. 1264–1266.

H. Gebretsadik et al., Lateral oxidation of InAlAs in InP–based heterostructures for long wave length vertical cavity surface emitting laser applications, *Appl. Phys. Lett.*, Jan. 12, 1998, vol. 72, No. 2, pp. 135–137.

N. Ohnoki et al., Proposal and Demonstration of AlAs–Oxide Confinement Structure for InP–based Long Wavelength Lasers, *Jpn. J. Appl. Phys.* vol. 36, part 1, No. 1A, Jan. 1997, pp. 148–149.

B. Koley et al. Dependence of Lateral oxidation rate on thickness of AiAs layer of interest as a current aperture in vertical–cavity surface emitting laser structures, *Journal of Applied Physics*, Jul. 1, 1998, vol. 84, No. 1, pp. 600–605.

\* cited by examiner

METHOD OF EFFICIENT CONTROLLABLE AND REPEATABLE WET OXIDATION IN A PHOSPHOROUS-RICH III-V MATERIAL SYSTEM

CROSS-REFERENCE TO RELATED PATENT APPLICATIONS

This application claims benefit of U.S. Provisional Application No. 60/254,787, filed Dec. 13, 2000, the disclosure of which is incorporated by reference in its entirety.

GOVERNMENT RIGHTS

This invention was made with government support pursuant to contract No. MDA90499C2506 awarded by the National Security Agency. The Government has certain rights in this invention.

FIELD OF INVENTION

This invention relates to a method of selectively oxidizing an aluminum-bearing III-V layer in a phosphorous-rich III-V material system. This invention also relates to a product made by such a method.

BACKGROUND OF THE INVENTION

Selective oxidation of semiconductor materials has been used successfully in designing various novel device structures. For example, oxidation of silicon is very popular in forming microelectronic devices. Recently selective oxidation of III-V semiconductor materials, i.e., a compound semiconductor material with elements from the Group III and Group V column of the Periodic Table, based on aluminum arsenide/gallium arsenide has been demonstrated. Wet thermal oxidation of $Al_xGa_{1-x}As$ layers is gradually being introduced in the optoelectronic device-manufacturing arena as it has proved to be a well controlled repeatable process. However, this oxidation process is limited to high aluminum content III-V based material systems such as $Al_xGa_{1-x}As$ lattice matched to GaAs.

While optical devices grown on this GaAs based material system typically have a wavelength of operation shorter than 1.0 µm (1000 nm), optical telecommunication systems generally operate at a longer wavelength of 1.55 µm. Devices used in the massively deployed base of a telecommunication network are not typically fabricated on a GaAs substrate. Instead, the material system of choice for optical communication systems is lattice matched to Indium Phosphide (InP).

Unfortunately, the only high aluminum content III-V materials that are lattice matched to InP are $AlAs_xSb_{(1-x)}$ materials with an x value near 0.5. There is no x value for which $Al_xGa_{(1-x)}As$ is lattice matched to InP. $Al_yIn_{(1-y)}As$ materials are more suitable but are only lattice matched to InP for y values near 0.48, which has a relatively low aluminum content for selective oxidation purposes. As a result, the advantages of selectively oxidized structures cannot be easily transferred to devices based on InP substrates.

The maximum Al composition of an arsenide-based III-V ternary material that is lattice matched with InP is $Al_{0.48}In_{0.52}As$. Because of the relatively small Al composition, the oxidation rate in this material has been observed to be very slow (~1 µm/hour at 500° C.). There have been efforts in pseudomorphically growing AlAs layers on InP substrates, but because of the huge lattice mismatch, the strain is detrimental to device performance and reliability.

Recently, strain-compensated ultra short-period InAs/AlAs short period super-lattices (SSLs) have been used for selective oxidation of InP based devices. A super lattice (SL) is a structure with alternating layers of different composition. Each layer of the SL may be quite thin. Generally a SL will have many periods of alternating layers, but the period should be at least two, i.e., the layers should repeat at least once. The layers of an SSL are only a few monolayers (ML) thick. Thus, the period of an SSL is short.

SUMMARY OF THE INVENTION

It would be an advantage to provide a method of forming an oxidation layer where the oxidation layer can be readily and efficiently selectively oxidized in a controllable and repeatable way, and where the method is compatible with current optoelectronic device fabrication technologies.

It would be an advantage to provide a method of selectively and rapidly forming an oxide layer in a phosphorous-rich III-V material system in a repeatable and controllable way without necessarily requiring lattice-matching.

According to one embodiment of the invention there is provided a method of selectively oxidizing III-V semiconductor material grown on a substrate within a phosphorous-rich material system comprising the steps of: providing a III-V compound semiconductor system comprising a short-period super lattice (SSL) of N periods of alternating layers of an aluminum-bearing III-V semiconductor material and a second III-V semiconductor material where $N \geq 2$, at least one phosphorous-rich III-V semiconductor layer, and at least one substantially phosphorous-free III-V semiconductor layer between each of the at least one phosphorous-rich layers and the SSL; and exposing the III-V semiconductor system to oxidizing atmosphere to selectively oxidize at least a portion of the SSL. A product formed by this method is also provided.

The method may further comprise removing a portion of the SSL to expose the edges of the alternating layers prior to the exposing to oxidizing atmosphere step. The removing step may comprise etching, cleaving, or sawing the III-V semiconductor system.

The at least one phosphorous-rich layer may comprise one of an InP, InGaAsP and GaP layer.

The at least one substantially phosphorous-free layer may comprise a substantially phosphorous-free super lattice (SL). The at least one substantially phosphorous-free SL may comprise a GaAs/InAs SSL. The at least one substantially phosphorous-free SL may be unstrained or strain-compensated to the substrate. The at least one substantially phosphorous-free layer may be an analog of the SSL. The at least one substantially phosphorous-free layer may comprise $In_{0.52}Al_xGa_{0.48-x}As$, wherein x is much less than 0.48 so that the oxidation rate of the phosphorous-free layer is low. The at least one substantially phosphorous-free layer may be phosphorous-free.

The SSL may be strain compensated. The SSL may have a total thickness in the range of about 20 to about 5000 nm.

The at least one phosphorous-rich layer may comprise an InP substrate. The at least one phosphorous-rich layer may comprise InGaP.

The aluminum-bearing material may comprise $In_{0.52}Al_xGa_{0.48-x}As$, wherein x is approximately 0.48. The aluminum-bearing material may comprise AlAs. The aluminum-bearing material may comprise AlGaAs.

The second material may comprise InAs.

The III-V semiconductor system may comprise one of a semiconductor laser, a semiconductor optical amplifier, a passive waveguide, a Vertical Cavity Surface Emitting Laser (VCSEL), and an in-plane laser.

The substantially phosphorous-free SL may comprise an InAs/GaAs/AlAs SSL or an InAs/AlAs SSL.

Each of the layers of the aluminum-bearing material may be two to three monolayers (ML) thick. Each of the layers of the second material may be two to three monolayers thick. The second material may be InAs and two to three ML thick. The aluminum-bearing material may be AlAs and two or three ML thick.

The exposing to oxidizing atmosphere step may comprise exposing the III–V semiconductor system to a moist $N_2$ gas flow. The exposing to oxidizing atmosphere step may comprise exposing the III–V semiconductor system to moisture at a temperature of about $\geq 500°$ C. The exposing to oxidizing atmosphere step may comprise exposing the III–V semiconductor system to an oxidizing atmosphere at a temperature of about $\geq 480°$ C. The exposing to oxidizing atmosphere step may comprise exposing the III–V semiconductor system to an oxidizing atmosphere including at least one of ozone, $H_2/O_2$, and moisture. The exposing to oxidizing atmosphere step may comprise exposing the III–V semiconductor system to steam at a temperature of about 515° C.

The number of periods N may be $\geq 50$.

The at least one phosphorous-rich III–V semiconductor layer may comprise phosphorous-rich III–V semiconductor layers on both sides of the SSL.

According to another embodiment there is provided a method of selectively oxidizing III–V semiconductor material comprising the steps of: providing a III–V semiconductor system comprising a InAs/AlAs short-period super lattice (SSL) of N periods of alternating layers of AlAs and InAs where $N \geq 2$, at least one phosphorous-rich III–V semiconductor layer, and at least one substantially phosphorous-free III–V semiconductor layer between each of the at least one phosphorous-rich layers and the SSL; and exposing the III–V semiconductor system to moisture at a temperature of about $\geq 500°$ C. to selectively oxidize at least a portion of the SSL.

According to another embodiment there is provided a method of selectively oxidizing III–V semiconductor material comprising the steps of: providing a III–V semiconductor system comprising a InAs/AlAs short-period super lattice (SSL) of N periods of alternating layers of AlAs and InAs where $N \geq 2$, at least one phosphorous-rich III–V semiconductor layer, and at least one substantially phosphorous-free III–V semiconductor layer between each of the at least one phosphorous-rich layers and the SSL; and exposing the III–V semiconductor system to an oxidizing atmosphere at a temperature of about $\geq 480°$ C. to selectively oxidize at least a portion of the SSL.

DETAILED DESCRIPTION OF THE PREFERRED EMBODIMENTS

The use of an aluminum-bearing short-period super lattice (SSL) in a phosphorous-rich III–V semiconductor material system can accelerate the oxidation of the SSL. Each period of the SSL layers includes a few monolayers (ML) of a group III–V semiconductor material that does not include aluminum and a few monolayers of an aluminum-bearing III–V semiconductor material. If the aluminum-bearing material cannot be grown in a lattice-matched way, one can choose the III–V material pairs in the superlattice, and the number of monolayers of the materials grown, so that the resultant SSL layer is strain compensated to the phosphorous-rich substrate material. Use of such an SSL layer significantly accelerates the wet oxidation rate compared to the analog counterpart of such SSL layers. When the SSL layers are exposed to an oxidizing atmosphere, such as water vapor, at high temperature the layers form a stable oxide.

The present inventors have found, however, that if these aluminum-bearing SSL layers are immediately surrounded by phosphorous-rich layers, such as InP, InGaAsP or GaP, at the high temperature (typically $\geq 500°$ C.) at which they are oxidized, slower oxidation and uncontrollable variation in oxidation depth results. The present inventors believe that the slower oxidation and uncontrollable variation in oxidation depth are possibly due to phosphorous diffusion from the immediately surrounding phosphorous-rich layers causing an impediment to the oxidation process. A structure suffering from this effect is illustrated in FIG. 1.

Figure 1:
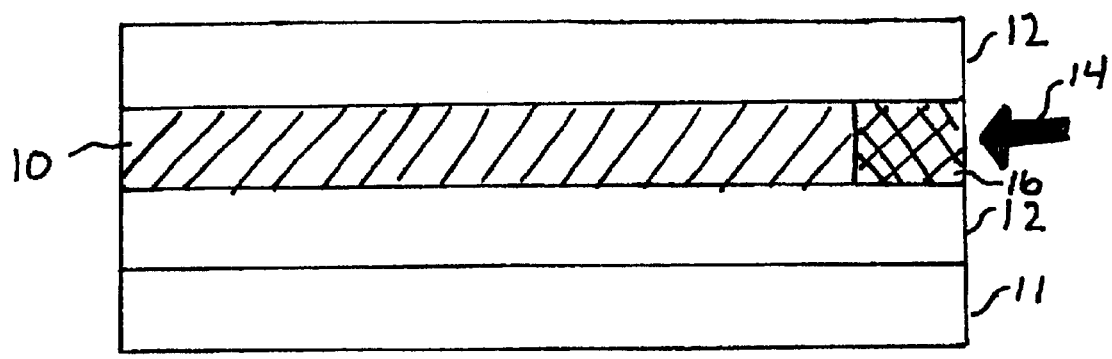
FIG. 1 is a schematic diagram illustrating a III–V material system including a III–V aluminum bearing SSL layer surrounded and contacted by phosphorous-rich III–V layers.

FIG. 1 is a schematic diagram illustrating a III–V material system including a III–V aluminum-bearing SSL layer 10 (the layer to be oxidized) surrounded and contacted by phosphorous-rich III–V layers 12. The III–V aluminum-bearing SSL layer 10 and the phosphorous-rich III–V layers 12 are grown over substrate 11. The III–V aluminum-bearing SSL layer 10 contains sufficient aluminum to allow layer 10 to be selectively oxidized when exposed to an oxidizing atmosphere, such as water vapor or moisture, at high temperature. The oxidizing atmosphere is indicated by arrow 14 in FIG. 1. The aluminum-bearing SSL layer 10 includes aluminum-bearing sublayers as will be described later.

As illustrated in FIG. 1, the aluminum-bearing SSL layer 10 is exposed to oxidizing atmosphere 14 to at least partially oxidize the aluminum-bearing SSL layer 10 to form oxidized portion 16. The present inventors have realized, however, that phosphorous from the phosphorous-rich III–V layers 12 contacting the aluminum-bearing SSL layer 10 acts to retard the oxidation of the aluminum-bearing SSL layer 10. The diffused phosphorous also acts to produce undesired process variability in the oxidation rate of the aluminum-bearing SSL layer 10. It is believed that the variability in oxidation rate may be due to non-uniformity in the diffusion of phosphorus.

The present inventors have found that the way to accelerate the oxidation rate and achieve reduction in the unpredictable process variability is to use phosphorous-deficient III–V semiconductor layers between the aluminum-bearing SSL layer (the layer to be oxidized) and the phosphorous-rich layers. Preferably, these phosphorous-deficient III–V semiconductor layers are aluminum-deficient as well as phosphorous-deficient. Moreover, the phosphorous-deficient layers need not be phosphorous-free. The phosphorous-deficient layers are at least substantially phosphorous-free so that the oxidation rate of the aluminum-bearing layer is not substantially affected by phosphorous diffusion. Thus, in this application substantially phosphorous-free means that the oxidation rate of the aluminum-bearing layer is not substantially affected by phosphorous diffusion.

Figure 2:
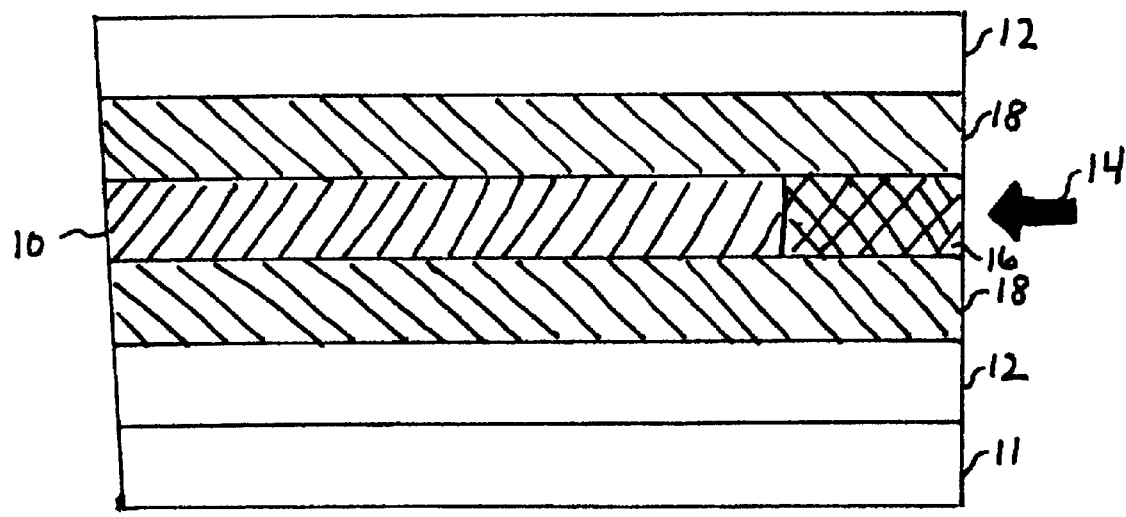
FIG. 2 is a schematic diagram according to the present invention illustrating a III–V material system including a III–V aluminum-bearing SSL layer with phosphorous-deficient layers between the SSL layer and phosphorous-rich III–V layers.

The structure of the phosphorous-deficient layers separating the aluminum-bearing SSL layer from phosphorous-rich layers is schematically illustrated in FIG. 2. In a similar fashion to the structure illustrated in FIG. 1, the structure in FIG. 2 includes a III–V aluminum-bearing SSL layer 10 and phosphorous-rich III–V layers 12 surrounding the aluminum-bearing SSL layer 10, where the layers are grown over substrate 11. However, FIG. 2 also includes III–V phosphorous-deficient layers 18 arranged between the phosphorous-rich III–V layers 12 and the aluminum-bearing SSL layer 10. It is believed that the phosphorous-deficient layers 18 act as a phosphorous diffusion barrier when the aluminum-bearing SSL layer 10 is exposed to an oxidizing atmosphere 14, such as moisture or water vapor, during a high temperature oxidation step to form the oxidized portion 16.

The phosphorous-rich III–V layers 12 generally comprise a III–V semiconductor material. Each of the phosphorous-rich III–V layers 12 may be, for example, one of InP, InGaAsP or GaP.

FIG. 2 illustrates the phosphorous-rich III–V layers 12 to be grown over the substrate 11. Alternatively one of the phosphorous-rich III–V layers 12 may be the substrate 11. For example, one of the phosphorous-rich III–V layers 12 may be the substrate 11, where the substrate comprises InP.

The III–V phosphorous-deficient layers 18 may comprise, for example, substantially phosphorous-free SLs. One or more of the substantially phosphorous-free SLs may comprise, for example, a GaAs/InAs, InAs/GaAs/AlAs or an InAs/AlAs SSL. The substantially phosphorous-free SL may be unstrained relative to the substrate 11. Alternatively, the substantially phosphorous-free SL may be strain-compensated relative to the substrate 11. The substrate 11 may be a III–V semiconductor material, such as InP, for example.

The phosphorous-deficient layers 18, i.e., the substantially phosphorous-free layers, may be an analog of the aluminum-bearing SSL layer 10. For example the phosphorous-deficient layers 18 may comprise $In_{0.52}Al_xGa_{0.48-x}As$, for example.

While the phosphorous-deficient layers 18 may contain some small amount of phosphorous, the phosphorous-deficient layers 18 may alternatively be phosphorous-free.

The aluminum-bearing SSL layer 10 may be strain compensated in some systems. Preferably, the aluminum-bearing SSL layer 10 has a total thickness in the range of about 20 to about 5000 nm.

FIG. 2 illustrates phosphorous-rich III–V layers 12 on both sides of the aluminum-bearing SSL layer 10. Of course, if the III–V material system includes a phosphorous-rich layer on only one side of the aluminum-bearing SSL layer, the structure need only include a phosphorous-deficient layer on the side having the phosphorous-rich layer where the phosphorous-deficient layer is between the SSL and any phosphorous-rich layers.

Figure 3:
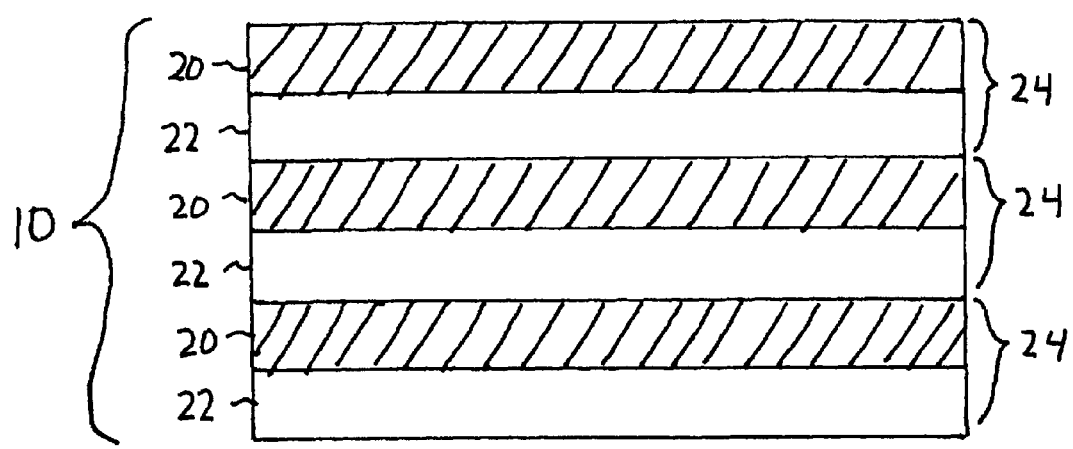
FIG. 3 is a more detailed view of the III–V aluminum-bearing SSL layer illustrating alternating layers of an aluminum-bearing III–V material and a second III–V material.

FIG. 3 illustrates a more detailed view of the aluminum-bearing SSL layer 10. The SSL layer 10 is formed of N periods 24 of alternating layers of an aluminum-bearing III–V semiconductor material 20 and a second III–V semiconductor material 22. Although FIG. 3 shows, for the purposes of illustration, the number of periods N to be three, in general the number of periods N is $\geq 2$. The number of periods N, may be, for example, $\geq 50$. Preferably, each of the aluminum-bearing III–V semiconductor material 20 layers and the second III–V semiconductor material 22 is two or three monolayers (ML) thick.

The aluminum-bearing III–V semiconductor material 20 may comprise, for example, $In_{0.52}Al_xGa_{0.48-x}As$, wherein x is approximately 0.48, AlGaAs or AlAs. The second III–V semiconductor material 22 may comprise, for example, InAs.

Each of the III–V semiconductor layers formed over the substrate 11 may be formed, for example, by molecular beam epitaxy (MBE). After the layers have been formed, the semiconductor system is exposed to an oxidizing atmosphere at high temperature to oxidize the aluminum-bearing SSL layer 10.

Returning again to FIG. 2, the semiconductor system shown in FIG. 2 is exposed to an oxidizing atmosphere 14 at a temperature sufficient to selectively oxidize the aluminum-bearing SSL layer 10. Preferably, a portion of the SSL layer 10 is removed prior to exposing edges of the SSL layer 10 to an oxidizing atmosphere. A portion of the SSL layer 10 may be removed, for example, by cleaving, sawing or etching.

The oxidizing atmosphere may be, for example, a moist $N_2$ gas flow, where the $N_2$ acts as a carrier gas. Alternatively the oxidizing atmosphere need only include an oxidizing agent without a carrier gas.

The SSL layer 10 should be heated during the oxidizing step to enhance oxidation. For example, the SSL layer 10 may be heated to a temperature of about $\geq 500°$ C. The SSL layer 10 may be heated to a temperature of about 515° C. in steam, for example. Alternatively, and especially in an efficient oxidizing atmosphere, the SSL layer 10 may be heated to a temperature of about $\geq 480°$ C. Other oxidizing methods include oxidizing in an atmosphere of ozone, or in-situ with $H_2/O_2$ combustion.

EXAMPLES

Using solid-source MBE, a III–V material structure having the layer structure as shown in Table I was grown. The layers of the III–V material structure are listed in the reverse order that they were grown, with the InP substrate listed last.

TABLE 1

| Layer number | Layer composition |
| --- | --- |
| 1 | 400 nm InP |
| 2 | (5.8 nm) 5x: 2 ML-GaAs/2 ML-InAs SSL |
| 3 | 100 nm 68x: 2 ML-AlAs/2 ML-InAs SSL |
| (Oxidation Layer 1) | |
| 4 | (5.8 nm) 5x: 2 ML-GaAs/2 ML-InAs SSL |
| 5 | 400 nm InP |
| 6 | (5.8 nm) 5x: 1 ML-GaAs/1 ML-AlAs/2 ML-InAs SSL |
| 7 | 100 nm 68x: 2 ML-AlAs/2 ML-InAs SSL |
| (Oxidation Layer 2) | |
| 8 | (5.8 nm) 5x: 1 ML-GaAs/1 ML-AlAs/2 ML-InAs SSL |

TABLE 1-continued

| Layer number | Layer composition |
| --- | --- |
| 9 | 400 nm InP |
| 10 (Oxidation Layer 3) | 100 nm 68x: 2 ML-AlAs/2 ML-InAs SSL |
| 11 | 400 nm InP |
| 12 (Oxidation Layer 4) | 100 nm Al$_{.48}$In$_{.52}$As |
| 13 | 300 nm InP |
| 14 | InP Substrate |

As can be seen in Table I, the layer structure included SSL aluminum-bearing oxidation layers immediately surrounded by phosphorous-deficient III–V semiconductor layers. The layer structure also included SSL aluminum-bearing oxidation layers immediately surrounded by phosphorous-rich III–V semiconductor layers for comparison. In Table I, ML is an abbreviation of monolayer and Nx denotes the number N of repetitions (or periods) of the layers in the SSL. The SSL oxidation layer, i.e., the layer to be oxidized, in this example is an AlAs/InAs SSL.

The first oxidation layer (or third layer overall) from the top is a strain compensated 100 nm thick AlAs(2ML)/InAs(2ML) SSL oxidation layer with 68 periods of AlAs(2ML)/InAs(2ML). The neighboring layers (layers 2 and 4) are phosphorous-free strain-compensated GaAs(2ML)/InAs(2ML) SSL layers. The second oxidation layer (seventh layer overall) is an AlAs(2ML)/InAs(2ML) SSL sandwiched between GaAs(1ML)/AlAs(1ML)/InAs(2ML) SSL layers (layers 6 and 8), which are equivalent in average composition to In$_{0.5}$Al$_{0.25}$Ga$_{0.25}$As layers and are not expected to oxidize as rapidly as the AlAs(2ML)/InAs(2ML) SSL oxidation layer.

The control layers include a third oxidation layer (layer 10 overall), a 100 nm thick AlAs(2ML)/InAs(2ML) SSL layer, and a fourth oxidation layer (layer 12 overall), an analog In$_{0.52}$Al$_{0.48}$As layer. Both the third and fourth oxidation layers are surrounded and contacted by InP layers. Specifically, the third oxidation layer is surrounded and contacted by two 400 nm InP layers (layers 9 and 11), while the fourth oxidation layer is immediately surrounded by a combination of a 300 nm InP layer (layer 13) and a 400 nm InP layer (layer 11).

Figure 4:
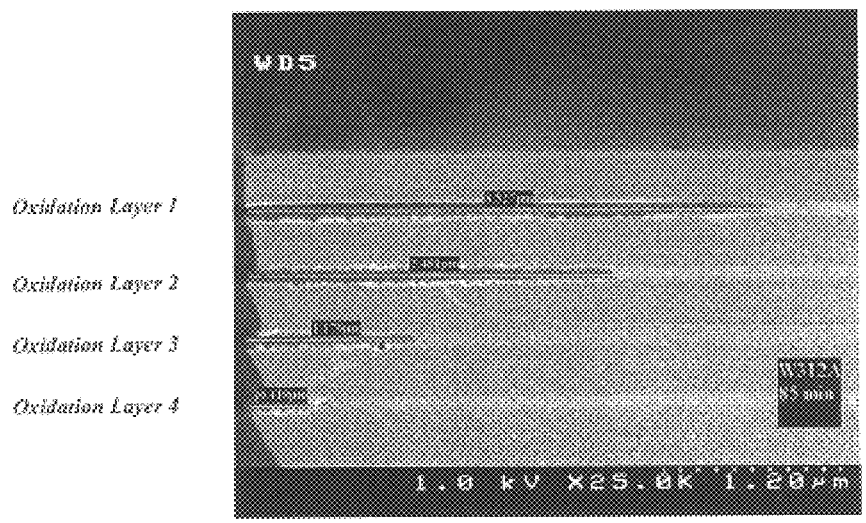
FIG. 4 is an SEM micrograph of a sample of aluminum-bearing SSL layers with different immediately surrounding layers, where the sample has been exposed to an oxidizing atmosphere.

The wafer containing the oxidation layers was cleaved to expose the edge of the oxidation layers and oxidized at 500° C. in moist N$_2$ gas flow for 85 minutes. A typical oxidized sample is shown in SEM (scanning electron microscope) micrograph FIG. 4. The oxidation depth in this typical sample was 3.527, 2.481, 1.179 and 0.410 μm, respectively, for the oxidation layers one through four as shown in FIG. 4.

The temporal variation of the oxidation depth for oxidation layers one through four was obtained. Each of the oxidation experiments was repeated to obtain the statistical variation of the oxidation depths in these four layers. Results are shown in FIG. 5.

Figure 5:
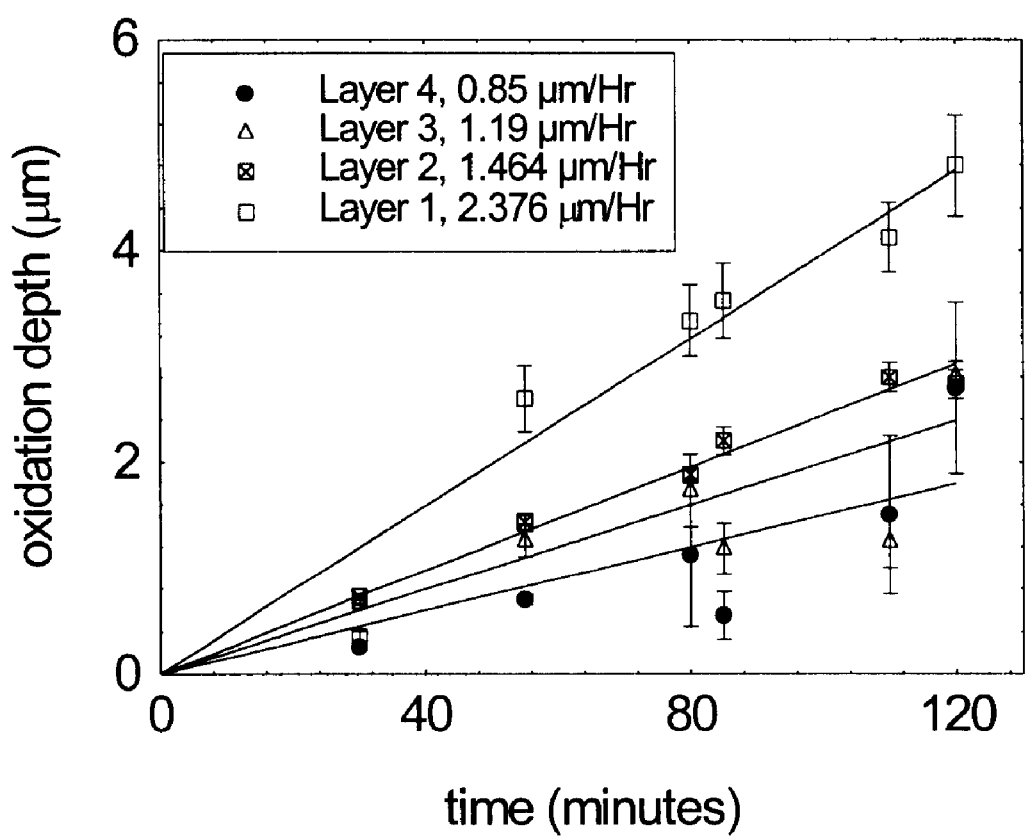
FIG. 5 is a graph showing the temporal dependence of the oxidation rate for aluminum-bearing SSL layers with different immediately surrounding layers.

As can be seen in FIG. 5, the nature of the neighboring layer, i.e., whether or not it is phosphorous-deficient, clearly has an effect on the oxidation depth. As seen in FIG. 5 there is a significant acceleration in the oxidation rate when the AlAs(2ML)/InAs(2ML) SSL layer (the first or top most oxidation layer in the sample) is sandwiched between phosphorous-free GaAs(2ML)/InAs(2ML) SSL layers. This strain compensated SSL oxidation layer oxidizes about three times faster than the generic In$_{0.52}$Al$_{0.48}$As analog layer sandwiched between InP layers and about twice as fast as the same strain compensated AlAs(2ML)/InAs(2ML) SSL layer which is surrounded by InP layers. This suggests that phosphorous diffusion from the InP layer causes the oxidation process to slow down.

The error bars on the data points, indicating the statistical distribution of data, as well as the data points themselves in the plot in FIG. 5 indicate a significant reduction in the spread of oxidation depth observed in repeated experiments for the oxidation layers not immediately surrounded by InP layers. The least spread in the depth of oxidation for repeated experiments is obtained for the second oxidation layer, an AlAs/InAs SSL layer which is immediately surrounded by a GaAs(1ML)/AlAs(1ML)/InAs(2ML) SSL layer. The variation of oxidation depth for a given oxidation time is less than 4% for this layer. For the first oxidation layer, the AlAs/InAs SSL layer which is surrounded by GaAs(2ML)/InAs(2ML) SSLs, the maximum variation in the measured oxidation depth for a given oxidation time is 12%. However, the spread in the oxidation depth is significantly higher for both the layers surrounded by phosphorous-rich InP, i.e., the third and fourth oxidation layers.

The maximum variation in the measured depth of oxidation for a given oxidation time for the AlAs/InAs SSL layer and the In$_{0.52}$Al$_{0.48}$As layer immediately surrounded by InP layers are 25% and 60%, respectively. This suggests that phosphorous diffusion from the neighboring phosphorous-rich quaternary material into the aluminum-bearing oxidation layer grown on a phosphorous-rich substrate not only acts as a reverse catalyst to decelerate the oxidation process, it also increases the nonuniformity in the oxidation depth significantly. The wet oxidation rate can be significantly accelerated by using an aluminum-bearing SSL layer as the oxidation layer surrounded by phosphorous-deficient analog or SSL (if required, strain compensated) layers.

The III–V semiconductor system described above may be applied to a number of different devices such as semiconductor lasers, semiconductor optical amplifiers, passive waveguides, Vertical Cavity Surface Emitting Lasers (VCSEL), and in-plane lasers.

The preferred embodiments have been set forth herein for the purpose of illustration. However, this description should not be deemed to be a limitation on the scope of the invention. Accordingly, various modifications, adaptations, and alternatives may occur to one skilled in the art without departing from the scope of the claimed inventive concept.

What is claimed is:

1. A method of selectively oxidizing III–V semiconductor material grown on a substrate within a phosphorous-rich material system comprising the steps of:

providing a III–V semiconductor system comprising a short-period super lattice (SSL) of N periods of alternating layers of an aluminum-bearing III–V semiconductor material and a second III–V semiconductor material where N≧2, at least one phosphorous-rich III–V semiconductor layer, and at least one substantially phosphorous-free III–V semiconductor layer between each of the at least one phosphorous-rich layers and the SSL; and exposing the III–V semiconductor system to oxidizing atmosphere to selectively oxidize at least a portion of the SSL.

2. A product formed by the method of claim 1.

3. The method of claim 1, further comprising:
removing a portion of the SSL to expose the edges of the alternating layers prior to the exposing to oxidizing atmosphere step.

4. The method of claim 3, wherein the removing step comprises one of cleaving, sawing and etching the III–V semiconductor system.

5. The method of claim 1, wherein the at least one phosphorous-rich layer comprises one of an InP, InGaAsP and GaP layer.

6. The method of claim 1, wherein the at least one substantially phosphorous-free layer comprises at least one substantially phosphorous-free super lattice (SL).

7. The method of claim 6, wherein the at least one substantially phosphorous-free SL comprises a GaAs/InAs SSL.

8. The method of claim 6, wherein the at least one substantially phosphorous-free SL is unstrained relative to the substrate.

9. The method of claim 6, wherein the at least one substantially phosphorous-free SL is strain-compensated to the substrate.

10. The method of claim 1, wherein the at least one substantially phosphorous-free layer is an analog of the SSL.

11. The method of claim 1, wherein the at least one substantially phosphorous-free layer comprises $In_{0.52}Al_xGa_{0.48-x}As$, wherein x is much less than 0.48 so that an oxidation rate of the substantially phosphorous-free layer is low.

12. The method of claim 1, wherein the at least one substantially phosphorous-free layer is phosphorous-free.

13. The method of claim 1, wherein the SSL is strain compensated.

14. The method of claim 1, wherein the SSL has a total thickness in the range of about 20 to about 5000 nm.

15. The method of claim 1, wherein the at least one phosphorous-rich layer comprises an InP substrate.

16. The method of claim 1, wherein the at least one phosphorous-rich layer comprises InGaP.

17. The method of claim 1, wherein the aluminum-bearing material comprises $In_{0.52}Al_xGa_{0.48-x}As$, wherein x is approximately 0.48.

18. The method of claim 1, wherein the aluminum-bearing material comprises AlAs.

19. The method of claim 1, wherein the aluminum-bearing material comprises AlGaAs.

20. The method of claim 1, wherein the second material comprises InAs.

21. The method of claim 1, wherein the III–V semiconductor system comprises one of a semiconductor laser, a semiconductor optical amplifier, a passive waveguide, a Vertical Cavity Surface Emitting Laser (VCSEL), and an in-plane laser.

22. The method of claim 1, wherein the substantially phosphorous-free layer comprises an InAs/GaAs/AlAs SSL or an InAs/AlAs SSL.

23. The method of claim 1, wherein each of the layers of the aluminum-bearing material is two to three monolayers (ML) thick.

24. The method of claim 1, wherein each of the layers of the second material is two to three monolayers thick.

25. The method of claim 1, wherein the second material is InAs and is two to three ML thick.

26. The method of claim 1, wherein the aluminum-bearing material is AlAs and is two to three ML thick.

27. The method of claim 1, wherein the exposing to oxidizing atmosphere step comprises exposing the III–V semiconductor system to a moist $N_2$ gas flow.

28. The method of claim 1, wherein the exposing to oxidizing atmosphere step comprises exposing the III–V semiconductor system to moisture at a temperature of about $\geq 500°$ C.

29. The method of claim 28, wherein the exposing to oxidizing atmosphere step comprises exposing the III–V semiconductor system to steam at a temperature of about 515° C.

30. The method of claim 1, wherein the exposing to oxidizing atmosphere step comprises exposing the III–V semiconductor system to an oxidizing atmosphere at a temperature of about $\geq 480°$ C.

31. The method of claim 1, wherein the exposing to oxidizing atmosphere step comprises exposing the III–V semiconductor system to an oxidizing atmosphere including at least one of ozone, $H_2/O_2$, and moisture.

32. The method of claim 1, wherein the number of periods N is $\geq 50$.

33. The method of claim 1, wherein the at least one phosphorous-rich III–V semiconductor layer comprises phosphorous-rich III–V semiconductor layers on both sides of the SSL.

34. A method of selectively oxidizing III–V semiconductor material comprising the steps of:
providing a III–V semiconductor system comprising a InAs/AlAs short-period super lattice (SSL) of N periods of alternating layers of AlAs and InAs where $N \geq 2$, at least one phosphorous-rich III–V semiconductor layer, and at least one substantially phosphorous-free III–V semiconductor layer between each of the at least one phosphorous-rich layers and the SSL; and
exposing the III–V semiconductor system to moisture at a temperature of about $\geq 500°$ C. to selectively oxidize at least a portion of the SSL.

35. A method of selectively oxidizing III–V semiconductor material comprising the steps of:
providing a III–V semiconductor system comprising a InAs/AlAs short-period super lattice (SSL) of N periods of alternating layers of AlAs and InAs where $N \geq 2$, at least one phosphorous-rich III–V semiconductor layer, and at least one substantially phosphorous-free III–V semiconductor layer between each of the at least one phosphorous-rich layers and the SSL; and
exposing the III–V semiconductor system to an oxidizing atmosphere at a temperature of about $\geq 480°$ C. to selectively oxidize at least a portion of the SSL.

* * * * *